United States Patent
Parkhe

(10) Patent No.: US 12,097,665 B2
(45) Date of Patent: Sep. 24, 2024

(54) POROUS PLUG BONDING

(71) Applicant: Applied Materials, Inc., Santa Clara, CA (US)

(72) Inventor: Vijay D. Parkhe, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 276 days.

(21) Appl. No.: 17/571,002

(22) Filed: Jan. 7, 2022

(65) Prior Publication Data

US 2022/0258431 A1 Aug. 18, 2022

Related U.S. Application Data

(60) Provisional application No. 63/150,543, filed on Feb. 17, 2021.

(51) Int. Cl.
*B29C 65/48* (2006.01)
*B29C 65/00* (2006.01)

(52) U.S. Cl.
CPC ........ *B29C 65/4835* (2013.01); *B29C 66/727* (2013.01)

(58) Field of Classification Search
CPC ... B29C 65/4835; B29C 65/56; B29C 65/565; B29C 65/72; B29C 66/727; B29C 66/5221; B29C 66/5229; B29C 66/52296; B29C 66/301; B29C 66/73186; H01L 21/67103; H01L 21/67109; H01L 21/67126; H01L 21/67098; H01L 21/68757; H01L 21/6833;

(Continued)

(56) References Cited

U.S. PATENT DOCUMENTS 5,696,189 A 12/1997 Legare
9,608,550 B2 3/2017 Comendant
(Continued)

FOREIGN PATENT DOCUMENTS

JP 2007221116 A 8/2007
JP 2014503005 A 2/2014
(Continued)

OTHER PUBLICATIONS

International Search Report and Written Opinion dated Apr. 25, 2022 for Application No. PCT/US2022/011413.
(Continued)

*Primary Examiner* — Philip C Tucker
*Assistant Examiner* — Brian R Slawski
(74) *Attorney, Agent, or Firm* — Patterson + Sheridan, LLP

(57) ABSTRACT

Embodiments described herein generally relate to porous plugs having sealing layers for use in substrate support pedestals and methods for forming the same. In one or more embodiments, the sealing layer can be formed in-situ by applying a fluoroelastomer composition to at least one of the porous plug and the walls of a cavity of an electrostatic chuck. The fluoroelastomer composition can be cured in-situ to form the sealing layer between the porous plug and the wall of the cavity. The porous plug is positioned within the cavity to control the flow of gas through a gas flow passage. The sealing layer is positioned adjacent to the porous plug and is capable of forming one or more of a radial seal between the porous plug and the wall of the cavity and an axial seal between the porous plug and a cooling base.

23 Claims, 7 Drawing Sheets

(58) Field of Classification Search
CPC .......... H01L 21/6831; H01L 21/68785; H01L 21/68714; H02N 13/00
USPC .......... 156/60, 293, 294, 296, 307.1, 307.3, 156/307.5, 333; 279/128
See application file for complete search history.

(56) References Cited

U.S. PATENT DOCUMENTS

| | | |
|---|---|---|
| 9,627,240 B2 | 4/2017 | Yamaguchi et al. |
| 9,905,449 B2 | 2/2018 | Yamaguchi et al. |
| 9,960,067 B2 | 5/2018 | Anada et al. |
| 10,249,526 B2 | 4/2019 | Parkhe |
| 10,688,750 B2 | 6/2020 | Parkhe et al. |
| 10,847,402 B2 | 11/2020 | Boyd, Jr. et al. |
| 11,380,572 B2 | 7/2022 | Prouty et al. |
| 11,651,982 B2 | 5/2023 | Fu et al. |
| 2003/0207118 A1* | 11/2003 | Fukushi .................. B32B 27/06 428/510 |
| 2009/0301712 A1 | 12/2009 | Campbell |
| 2009/0302001 A1 | 12/2009 | Mayers et al. |
| 2011/0005681 A1 | 1/2011 | Savas et al. |
| 2012/0100379 A1* | 4/2012 | Luo .................. B32B 27/06 523/400 |
| 2014/0088808 A1 | 3/2014 | Kawasaki |
| 2014/0107280 A1 | 4/2014 | Luo et al. |
| 2014/0376148 A1 | 12/2014 | Sasaki et al. |
| 2015/0279714 A1 | 10/2015 | Yamaguchi et al. |
| 2016/0352260 A1 | 12/2016 | Comendant |
| 2017/0178944 A1 | 6/2017 | Yamaguchi et al. |
| 2017/0243726 A1 | 8/2017 | Kellogg |
| 2017/0256431 A1 | 9/2017 | Parkhe |
| 2019/0242480 A1 | 8/2019 | Nakagawa et al. |
| 2019/0252231 A1* | 8/2019 | Takasaki .............. H01L 21/6833 |
| 2019/0267277 A1 | 8/2019 | Sasaki et al. |
| 2019/0371578 A1 | 12/2019 | Larosa et al. |
| 2020/0035535 A1 | 1/2020 | Parkhe |
| 2020/0105568 A1 | 4/2020 | Pilgrim |
| 2020/0279765 A1 | 9/2020 | Furukawa |
| 2020/0373184 A1* | 11/2020 | Prouty .............. H01L 21/67376 |
| 2020/0411283 A1 | 12/2020 | Bonecutter et al. |
| 2020/0411355 A1 | 12/2020 | Noorbakhsh et al. |

FOREIGN PATENT DOCUMENTS

| | | |
|---|---|---|
| JP | 2015195346 A | 11/2015 |
| JP | 2017157726 A | 9/2017 |
| JP | 2018101773 A | 6/2018 |
| JP | 2020035886 A | 3/2020 |
| KR | 20200019591 A | 2/2020 |
| WO | 2019009028 A1 | 1/2019 |
| WO | 2019082875 A1 | 5/2019 |

OTHER PUBLICATIONS

Taiwan Office Action dated May 11, 2023 for Application No. 111101232.
Japanese Office Action dated May 14, 2024 for Application No. 2023-505367.
Korean Office Action dated May 22, 2024 for Application No. 10-2023-7002239.

* cited by examiner

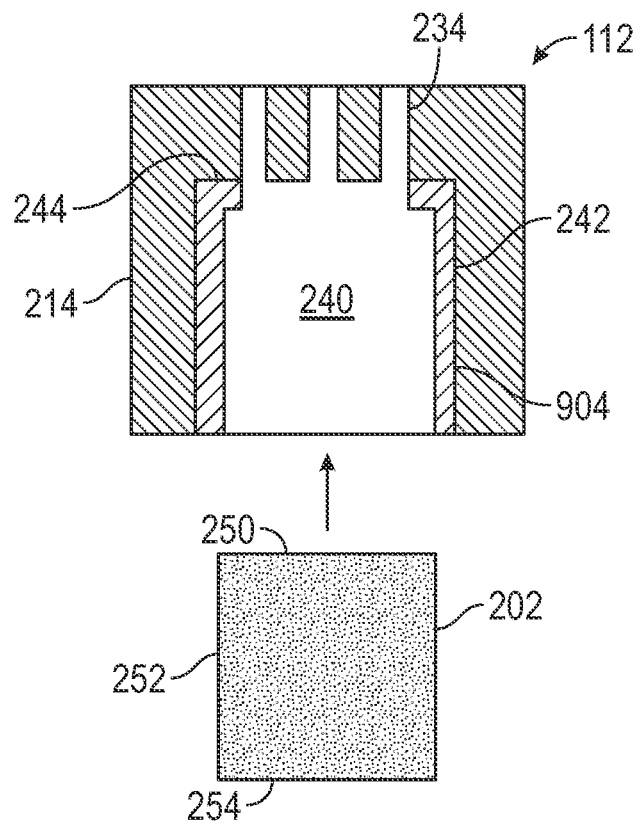
FIG. 9A
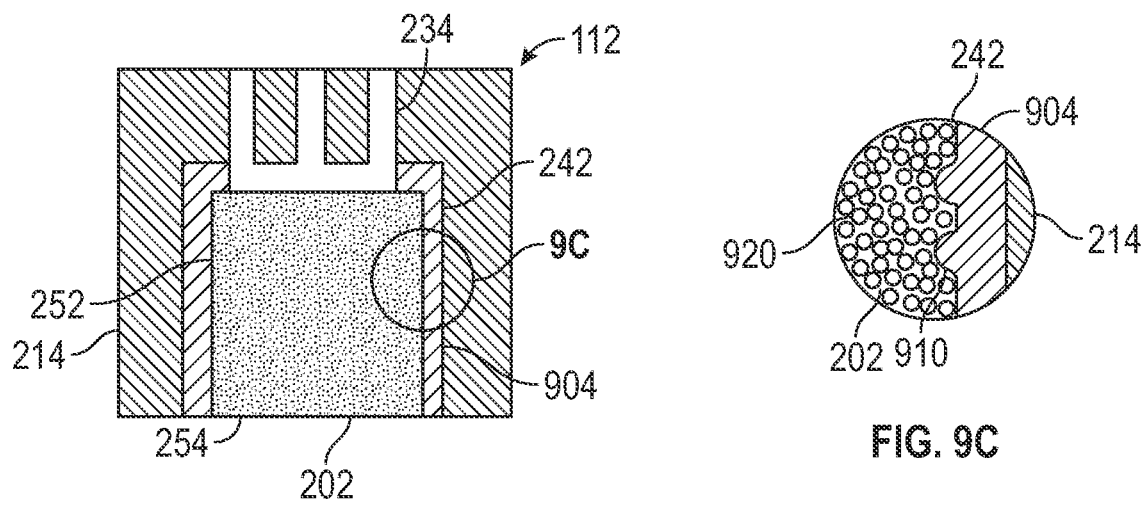
FIG. 9B
FIG. 9C

POROUS PLUG BONDING

CROSS-REFERENCE TO RELATED APPLICATION

This application claims benefit of U.S. Prov. Appl. No. 63/150,543, filed on Feb. 17, 2021, which is herein incorporated by reference.

BACKGROUND

Field

Implementations described herein generally relate to a substrate support pedestal and more particularly to a substrate support pedestal having a bonded porous plug and methods of bonding the porous plug with the substrate support pedestal.

Description of the Related Art

Substrate support pedestals are widely used to support substrates within semiconductor processing systems during processing. One particular type of substrate support pedestal includes a ceramic electrostatic chuck mounted on a cooling base. Electrostatic chucks generally retain the substrate in a stationary position during processing. Electrostatic chucks contain one or more embedded electrodes within a ceramic body. As an electrical potential is applied between the electrodes and a substrate disposed on the ceramic body, an electrostatic attraction is generated, which holds the substrate against a support surface of the ceramic body. The force generated may have a capacitive effect due to a potential difference between the substrate and the electrodes or, in the case of ceramic bodies comprised of semiconducting materials having a relatively low resistivity, which allow charge migration within the ceramic body to the surface approximate the substrate, a Johnsen-Rahbeck effect. Electrostatic chucks utilizing capacitive and Johnsen-Rahbeck attractive forces are commercially available from a number of sources.

To control the substrate temperature during processing, a backside gas is provided between the support surface of the ceramic body and the substrate. Generally, the backside gas fills the interstitial area between the ceramic body and the substrate, thus providing a heat transfer medium that enhances the rate of heat transfer between the substrate and the substrate support.

A bond layer secures the electrostatic chuck to the cooling base. The bond layer is susceptible to erosion by process gases passing through the bond layer. Additionally, the eroded bond layer may be ignited, energized, or otherwise facilitate arcing in the portion of the backside gas channel passing through the substrate support pedestal that is exposed to the bond layer. The erosion of the bond layer is problematic for at least three reasons. First, material eroded from the bond layer is a process contaminant that produces defects and reduces product yields. Second, as the hole in the bond layer through which the backside gas passes increases in size, the local rate heat transfer between the electrostatic chuck and the cooling base changes as the bond material is replaced by a gap, thereby creating undesirable temperature non-uniformities and process drift. Third, the eroded bond layer can provide a path from substrate to ground potential along the sidewall.

Therefore, there is a need for an improved substrate support pedestal and methods of manufacturing the same.

SUMMARY

Implementations described herein generally relate to a substrate support pedestal and more particularly to a substrate support pedestal having a bonded porous plug and methods of bonding the porous plug with the substrate support pedestal.

In one aspect, a method of manufacturing a chuck body is provided. The method includes coating a porous plug with a coating comprising a fluoroelastomer composition. The method further includes inserting the porous plug having the coating formed thereon into a cavity defined by a wall formed in a chuck body. The method further includes curing the coating to form a sealing layer between the porous plug and the wall of the cavity.

Implementations may include one or more of the following. The coating has a thickness of about 25 microns to about 1,000 microns. The coating is partially cured to form a partially-cured fluoroelastomer layer on the porous plug prior to inserting the porous plug. The sealing layer forms a radial seal between the porous plug and the wall of the cavity. The sealing layer further forms an axial seal between the porous plug and a cooling base bonded to the chuck body. The sealing layer further forms an axial seal between a top surface of the porous plug and a second wall of the cavity. The porous plug has a cylindrical shape or t-shape. The fluoroelastomer composition is in the form of a paste having a viscosity of about 50 cP to about 5,000 cP. The fluoroelastomer composition comprises at least one perfluoropolymer. The fluoroelastomer composition further comprises at least one of curing agents, adhesion promoters, thickening agents, solvents, and fillers.

In another aspect, a method of manufacturing a chuck body is provided. The method includes coating a wall of a cavity formed in a chuck body with a coating comprising a fluoroelastomer composition. The method further includes inserting a porous plug into the cavity having. The method further includes curing the coating to form a sealing layer between the porous plug and the wall of the cavity.

Implementations may include one or more of the following. The coating has a thickness of about 25 microns to about 1,000 microns. The coating is partially cured to form a partially-cured fluoroelastomer layer on the wall of the cavity prior to inserting the porous plug. The sealing layer forms a radial seal between the porous plug and the wall of the cavity. The sealing layer further forms an axial seal between the porous plug and a cooling base bonded to the chuck body. The sealing layer further forms an axial seal between a top surface of the porous plug and a second wall of the cavity. The porous plug has a cylindrical shape or t-shape. The fluoroelastomer composition is in the form of a paste having a viscosity of about 50 cP to about 5,000 cP. The fluoroelastomer composition comprises at least one perfluoropolymer. The fluoroelastomer composition further comprises at least one of curing agents, adhesion promoters, thickening agents, solvents, and fillers.

In yet another aspect, a method of manufacturing a chuck body is provided. The method includes coating a porous plug with a first coating including a fluoroelastomer composition. The method further includes coating a wall of a cavity formed in a chuck body with a second coating including the fluoroelastomer composition. The method further includes inserting the porous plug having the first coating formed thereon into the cavity having the second coating formed thereon. The method further includes curing the first coating and the second coating to form a sealing layer between the porous plug and the wall of the cavity.

Implementations may include one or more of the following. At least one of the first coating and the second coating are partially cured to form a partially-cured fluoroelastomer layer on at least one of the porous plug and the wall of the cavity prior to inserting the porous plug. At least one of the first coating and the second coating has a thickness of about 25 microns to about 1,000 microns. The sealing layer forms a radial seal between the porous plug and the wall of the cavity. The sealing layer further forms an axial seal between the porous plug and a cooling base bonded to the chuck body. The sealing layer further forms an axial seal between a top surface of the porous plug and a second wall of the cavity. The porous plug has a cylindrical shape or t-shape. The fluoroelastomer composition is in the form of a paste having a viscosity of about 50 cP to about 5,000 cP. The fluoroelastomer composition includes at least one perfluoropolymer. The fluoroelastomer composition further includes at least one of curing agents, adhesion promoters, thickening agents, solvents, and fillers.

In another aspect, a method of manufacturing a chuck body is provided. The method includes coating a porous plug with a coating including a fluoroelastomer composition. The method further includes curing the coating to form a sealing layer on the porous plug. The method further includes inserting the porous plug having the sealing layer formed thereon into a cavity of a chuck body having a wall, wherein the sealing layer compresses to form a seal between the wall of the cavity and the porous plug.

Implementations may include one or more of the following. The coating has a thickness of about 25 microns to about 1,000 microns. The sealing layer forms a radial seal between the porous plug and the wall of the cavity. The sealing layer further forms an axial seal between the porous plug and a cooling base bonded to the chuck body. The sealing layer further forms an axial seal between a top surface of the porous plug and a second wall of the cavity. The porous plug has a cylindrical shape or t-shape. The fluoroelastomer composition is in the form of a paste having a viscosity of about 50 cP to about 5,000 cP. The fluoroelastomer composition includes at least one perfluoropolymer. The fluoroelastomer composition further at least one of curing agents, adhesion promoters, thickening agents, solvents, and fillers.

In yet another aspect, a method of manufacturing a chuck body is provided. The method includes coating a wall of a cavity formed in a chuck body with a first coating including a fluoroelastomer composition. The method further includes curing the coating to form a sealing layer on the wall of the cavity. The method further includes inserting a porous plug into the cavity having the sealing layer formed thereon, wherein the sealing layer compresses to form a seal between the wall of the cavity and the porous plug.

Implementations can include one or more of the following potential advantages. The coating has a thickness of about 25 microns to about 1,000 microns. The sealing layer forms a radial seal between the porous plug and the wall of the cavity. The sealing layer further forms an axial seal between the porous plug and a cooling base bonded to the chuck body. The sealing layer further forms an axial seal between a top surface of the porous plug and a second wall of the cavity. The porous plug has a cylindrical shape or t-shape. The fluoroelastomer composition is in the form of a paste having a viscosity of about 50 cP to about 5,000 cP. The fluoroelastomer composition includes at least one perfluoropolymer. The fluoroelastomer composition further includes at least one of curing agents, adhesion promoters, thickening agents, solvents, and fillers.

In yet another aspect, a method of manufacturing a chuck body is provided. The method includes coating a porous plug with a first coating including a fluoroelastomer composition. The method further includes partially curing the first coating to form a first partially-cured sealing layer on the porous plug. The method further includes coating a wall of a cavity formed in a chuck body with a second coating including the fluoroelastomer composition. The method further includes inserting the porous plug having the first partially-cured sealing layer formed thereon into the cavity having the second coating formed thereon. The method further includes curing the first partially-cured sealing layer and the second coating to form a sealing layer between the porous plug and the wall of the cavity.

Implementations can include one or more of the following potential advantages. At least one of the first coating and the second coating has a thickness of about 25 microns to about 1,000 microns. The sealing layer forms a radial seal between the porous plug and the wall of the cavity. The sealing layer further forms an axial seal between the porous plug and a cooling base bonded to the chuck body. The sealing layer further forms an axial seal between a top surface of the porous plug and a second wall of the cavity. The porous plug has a cylindrical shape or t-shape. The fluoroelastomer composition is in the form of a paste having a viscosity of about 50 cP to about 5,000 cP. The fluoroelastomer composition includes at least one perfluoropolymer. The fluoroelastomer composition further includes at least one of curing agents, adhesion promoters, thickening agents, solvents, and fillers.

In yet another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIGS. 9A-9C depict schematic cross-sectional views of forming a substrate pedestal having a bonded porous plug according to one or more implementations of the present disclosure.

Figure 1:
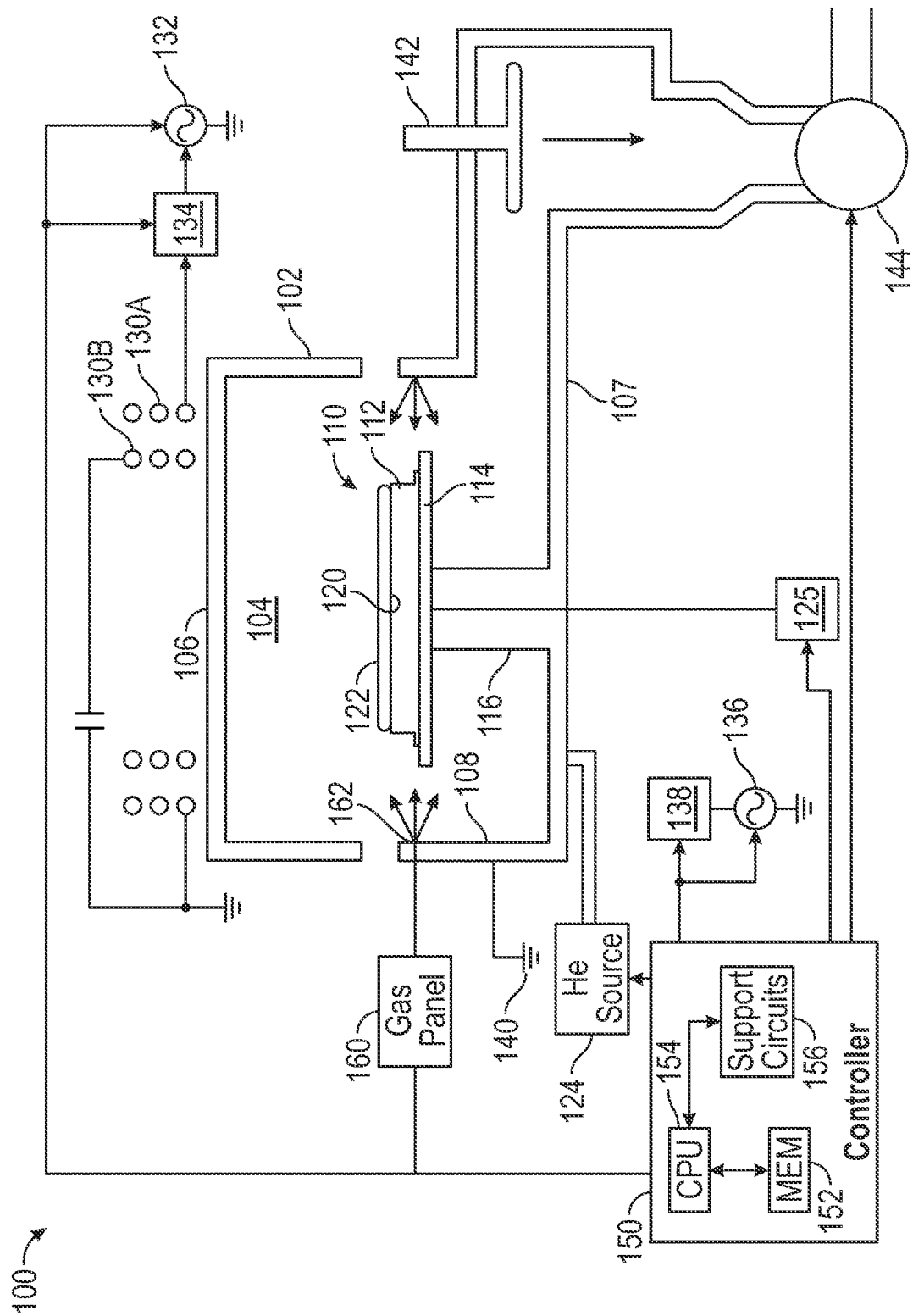
FIG. 1 is a schematic view of a process chamber including a substrate support pedestal having a bonded porous plug according to one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes bonded porous plugs and methods of forming bonded porous plugs. Certain details are set forth in the following description and in FIGS. 1-9C to provide a thorough understanding of various implementations of the disclosure. Other details describing well-known structures and systems often associated with bonded porous plug formation and elastomeric polymers are not set forth in the following disclosure to avoid unnecessarily obscuring the description of the various implementations. In addition, the apparatus description described herein is illustrative and should not be construed or interpreted as limiting the scope of the implementations described herein.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Porous plugs are used with electrostatic chucks to allow backside gases to reach and cool a substrate positioned on the electrostatic chuck while preventing process gases from travelling downward through the electrostatic chuck. One method for bonding porous plugs to the electrostatic chucks includes the use of silicone to bond the porous plug to the electrostatic chuck. However, a potential problem with silicone is that it forms bonds with fluorine from fluorine process gases. This fluorine can lead to undesirable arcing from the substrate to ground via the fluorine contaminated bonding layer. Thus it would be advantageous to have bonding materials for porous plugs and methods of bonding porous plugs, which reduce or prevent undesirable arcing.

The systems and methods discussed herein employ substrate support pedestals that have a cooling base and electrostatic chuck bonded together via a bond layer. A porous plug is positioned in a gas flow passage formed in the cooling base and the electrostatic chuck. The porous plug is bonded to the electrostatic chuck using a sealing layer formed from a fluoroelastomer composition. The sealing layer in combination with the porous plug protects the bond layer from the process gases utilized during substrate processing. Advantageously, the following implementations discuss improved techniques for securing the porous plug within the gas flow passage to prevent degradation of the bond layer through utilization of the sealing layer that substantially prevents gas flowing around the porous plug. In addition, the sealing layer is composed of a fluorine resistant material. This is an improvement over silicone materials used to bond porous plugs to an electrostatic chuck. These silicone materials are susceptible to fluorine contamination from process gases, which can lead to arcing from the semiconductor substrate to ground via the fluorine contaminated silicone material. In addition, the fluoroelastomer composition can be applied as a viscosity adjusted liquid. Further the sealing layer formed from the fluoroelastomer composition can survive temperatures greater than silicone compounds.

As used herein, a "fluoroelastomer composition" refers to a polymeric composition including a curable fluoropolymer. A fluoropolymer may be formed by polymerizing two or more monomers, preferably one of which is fluorinated or perfluorinated, and at least one of which is a cure site monomer to permit curing, for example, at least one fluoropolymeric curesite monomer. A fluoroelastomer composition as described herein may include any suitable curable fluoroelastomeric fluoropolymer(s) (FKM) or perfluoroelastomeric fluoropolymer(s) (FFKM) capable of being cured to form a fluoroelastomer or a perfluoroelastomer, and one or more curatives as described herein.

A perfluoroelastomer, as used herein, may be any substantially cured elastomeric material derived by curing a perfluoropolymer (as defined herein) having at least one cross-linking group to permit cure provided by at least one cure site monomer. A perfluoropolymer, as used herein, is substantially fluorinated, and preferably completely fluorinated, with respect to the carbon atoms on the backbone of the perfluoropolymer. It will be understood that some residual hydrogen may be present in the perfluoroelastomer within the cross links due to use of hydrogen in the functional cross linking group in some types of perfluoroelastomer formulations.

Fluoroelastomer compositions and perfluoroelastomer compositions, also known as fluorocarbon elastomers, as used herein, may be cured or uncured (curable). When modified by the term "uncured" or "curable", fluoroelastomer or perfluoroelastomer compositions refer to the composition containing the fluoropolymer or perfluoropolymer, but in which such cross-links have yet to substantially occur such that the material is not yet suitable for the intended application.

The fluoroelastomer composition described herein may contain several different ingredients in various permutations as described in detail below, such as one or more fluoropolymers, perfluoropolymers with one or more of various cure sites, curing agents, adhesion promoters, thickening agents, solvents, and numerous other optional fillers and additives.

In some implementations, curable elastomeric perfluoropolymers can include two or more of various perfluorinated co-polymers of at least one of which is fluorine-containing ethylenically unsaturated monomer, such as tetrafluoroethylene (TFE), a perfluorinated olefin, such as hexafluoropropylene (HFP), and a perfluoroalkylvinyl ether (PAVE) that include alkyl groups that are straight or branched and which include one or more ether linkages, such as perfluoro (methyl vinyl ether), perfluoro (ethyl vinyl ether), perfluoro (propyl vinyl ether) and similar compounds. Suitable examples of PAVEs include perfluoro (methyl vinyl) ether (PMVE) and perfluoro (propyl vinyl) ether (PPVE). In one example, PAVE has the formula $CF_2=CFO(CF_2CFXO)_nR_f$ wherein X is F or $CF_3$, n is 0-5, and $R_f$ is a perfluoroalkyl group of 1-6 carbon atoms. Suitable perfluoropolymers may be those that meet the industry accepted definition of a perfluoroelastomer listed as an FFKM in ASTM D-1418 and, are may be terpolymers or tetrapolymers of TFE, PAVE, and have one perfluorinated cure site monomer that incorporates a functional group to permit cross linking of the terpolymer, at least one of which is a cure site capable of being cured by the cure systems used in the practice of the present disclosure. These monomers can be used in conjunction with a comonomer which facilitates crosslinking. Small concentrations of monomers which are not perfluorinated can also be used. Normally, such monomers are employed to obtain desirable crosslinking characteristics and may be present in concentrations of up to about 3 mole %. Examples of such monomers include bromotetrafluorobutene, bromotrifluoroethylene, vinylidene fluoride and monomers containing nitrile groups.

In their uncured or curable state, the fluoroelastomer compositions of the present disclosure can include at least one curing agent that corresponds to (e.g., is capable of facilitating the cross linkage of) one of the at least one cure site monomers that is present on the fluoropolymer. Any curing agent or combination of curing agents may be used. As examples, a peroxide-curable system or a cyano-curable system, can be used, depending on the end product and physical characteristics desired of the fluoroelastomer compositions. Regardless of the cure system or combination of systems employed, the fluoropolymer may contain at least one cure site monomer, although the presence of about 2 to about 20 cure site monomers (the same or different) may be desired. The curing agent can be present in the amount necessary to provide adequate cure.

The fluoroelastomer composition may contain an acrylate compound, e.g., any compound known or developed in the art that includes one or more functional acrylate groups. The acrylate compound may be a metal acrylate or combination of differing acrylate compounds and/or metal acrylates. Examples may include diacrylate, methacrylates, dimethacrylate, triacrylate, and/or tetracrylate compounds. More specifically, suitable examples may include diacrylates and methacrylates of zinc or copper. Such compounds are known to be commercially available from, for example, Sartomer, of Exton, Pa., United States of America (tradenames, for example, SARET® SR633 and SARET® SR634). Also included are perfluoroelastomers, fluoroelastomers, elastomers or other resins that contain acrylate groups incorporated into their structure.

The fluoroelastomer composition may also contain one or more additional additives, such as, for example, fillers, plasticizers, polymer blends, and colorings. If desired, other additives may include, for example, carbon black, glass fibers, glass spheres, silicates, fiberglass, calcium sulfate, asbestos, boron fibers, ceramic fibers, aluminum hydroxide, barium sulfate, calcium carbonate, fluorographite, magnesium carbonate, alumina, aluminum nitride, borax, perlite, zinc terephthalate, silicon carbide platelets, wollastonite, calcium terephthalate, fullerene tubes, Hectorite, talc, mica, carbon nanotubes, and silicon carbide whiskers.

The above-discussed fluoroelastomer composition may contain any or all of the various ingredients discussed above in any proportion, ratio, or permutation. Individuals of skill in the art will recognized such ingredients and relative ratios may be altered and varied depending on the desired characteristics of the end product, which in turn is informed by the application into which the bonded component is to used.

Upon cure the fluoroelastomer composition forms a sealing layer, which also bonds the porous plug with the electrostatic chuck.

In some implementations of the present disclosure, the fluoroelastomer composition is bonded to the porous plug and/or the electrostatic chuck by contacting a curable perfluoroelastomer composition (as described herein) to the porous plug and/or the electrostatic chuck and curing it via any curing processes known or developed in the art. In some implementations of the present disclosure, the fluoroelastomer composition is bonded to the porous plug and/or the electrostatic chuck by contacting a curable perfluoroelastomer composition to the porous plug and/or the electrostatic chuck and partially curing or semi-curing (e.g., some crosslinking may have occurred, but not to the desired extent). The porous plug and/or the electrostatic chuck coated with the semi-cured fluoroelastomer composition can be contacted with another inert substrate and cured in situ to form the final fluoroelastomer sealing layer between the porous plug and the electrostatic chuck.

Curing or partially-curing (e.g., semi-curing) in any method may be accomplished by any process known or to be developed in the art including heat cure, cure by application of high energy, heat cure, press cure, steam cure, a pressure cure, an e-beam cure or cure by any combination thereof. Post-cure treatments may also be applied, if desired.

In some implementations, the fluoroelastomer composition is applied as a paste. As used herein, a "paste" refers to a heterogeneous composition having a viscosity of about 1 centipoise (cP) to about 10,000 cP. A "heterogeneous composition" refers to a composition having more than one excipient or component. As used herein, "paste" can also refer to a gel, a cream, a glue, an adhesive, and any other viscous liquid or semi-solid. In some implementations, a paste for use with the present disclosure has a tunable viscosity, and/or a viscosity that can be controlled by one or more external conditions.

In some implementations, the fluoroelastomer composition is in the form of a paste having a viscosity of about 1 cP to about 10,000 cP. In some implementations, fluoroelastomer composition is in the form of a paste having a minimum viscosity of about 1 cP, about 2 cP, about 5 cP, about 10 cP, about 15 cP, about 20 cP, about 25 cP, about 30 cP, about 40 cP, about 50 cP, about 60 cP, about 75 cP, about 100 cP, about 125 cP, about 150 cP, about 175 cP, about 200 cP, about 250 cP, about 300 cP, about 400 cP, about 500 cP, about 750 cP, about 1,000 cP, about 1,250 cP, about 1,500 cP, or about 2,000 cP. In some implementations, the fluoroelastomer composition is in the form of a paste having a maximum viscosity of about 10,000 cP, about 9,500 cP, about 9,000 cP, about 8,500 cP, about 8,000 cP, about 7,500 cP, about 7,000 cP, about 6,500 cP, about 6,000 cP, about 5,500 cP, about 5,000 cP, about 4,000 cP, about 3,000 cP, about 2,000 cP, about 1,000 cP, about 500 cP, about 250 cP, about 100 cP, or about 50 cP.

In some implementations, the fluoroelastomer composition is in the form of a paste having a viscosity of about 50 cP to about 5,000 cP, about 50 cP to about 4,000 cP, about 50 cP to about 3,000 cP, about 50 cP to about 2,000 cP, about 50 cP to about 1,000 cP, about 80 cP to about 500 cP, about 80 cP to about 450 cP, about 80 cP to about 400 cP, about 80 cP to about 300 cP, about 80 cP to about 250 cP, about 80 cP to about 200 cP, about 80 cP to about 150 cP, about 100 cP to about 1,000 cP, about 100 cP to about 900 cP, about 100 cP to about 800 cP, about 100 cP to about 700 cP, about 100 cP to about 600 cP, about 100 cP to about 500 cP, about 100 cP to about 400 cP, about 100 cP to about 300 cP, about 100 cP to about 250 cP, about 200 cP to about 500 cP, about 200 cP to about 400 cP, about 250 cP to about 500 cP, about 300 cP to about 500 cP, or about 400 cP to about 500 cP.

Typically, the viscosity of the fluoroelastomer composition is controlled. In some implementations, the viscosity of the fluoroelastomer composition is adjusted based on the pore size of the pores formed in the porous plug. For example, the viscosity of the fluoroelastomer composition is adjusted so that the fluoroelastomer composition coats the surface of the porous plug 202 but does not fill the internal pores of the porous plug 202. Parameters that can control viscosity of the fluoroelastomer composition include, but are not limited to, the average length, molecular weight, and/or degree of cross-linking of a copolymer; as well as the presence of a solvent and a concentration of a solvent; the presence of the a thickener (i.e., a viscosity-modifying component) and a concentration of a thickener; a particle size of a component present in the paste; the free volume (i.e., porosity) of a component present in the paste; the swellability of a component present in the paste; an ionic interaction between oppositely charged and/or partially charged species present in the paste (e.g., a solvent-thickener interaction); or a combinations thereof.

In some implementations where it is desirable to adjust the viscosity of the fluoroelastomer composition, the fluoroelastomer composition further includes at least one of a solvent and a thickening agent. In some implementations, the combination of a solvent and a thickening agent can be selected to adjust the viscosity of a paste.

Thickening agents suitable for use with the fluoroelastomer composition of the present disclosure include, but are not limited to, metal salts of carboxyalkylcellulose derivatives (e.g., sodium carboxymethylcellulose), alkylcellulose derivatives (e.g., methylcellulose and ethylcellulose), partially oxidized alkylcellulose derivatives (e.g., hydroxyethylcellulose, hydroxypropylcellulose and hydroxypropylmethylcellulose), starches, polyacrylamide gels, homopolymers of poly-N-vinylpyrrolidone, poly(alkyl ethers) (e.g., polyethylene oxide and polypropylene oxide), agar, agarose, xanthan gums, gelatin, dendrimers, colloidal silicon dioxide, and combinations thereof. In some implementations, a thickening agent is present in the fluoroelastomer composition in a concentration of about 0.1% to about 50%, about 0.5% to about 25%, about 1% to about 20%, or about 5% to about 15% by weight of the paste.

In some implementations, the fluoroelastomer composition further includes a solvent. Solvents suitable for use in the fluoroelastomer composition of the present disclosure include, but are not limited to, water, $C_1$-$C_8$ alcohols (e.g., methanol, ethanol, propanol and butanol), $C_6$-$C_{12}$ straight chain, branched and cyclic hydrocarbons (e.g., hexane and cyclohexane), $C_6$-$C_{14}$ aryl and aralkyl hydrocarbons (e.g., benzene and toluene), $C_3$-$C_{10}$ alkyl ketones (e.g., acetone), $C_3$-$C_{10}$ esters (e.g., ethyl acetate), $C_4$-$C_{10}$ alkyl ethers, or a combination thereof. In some embodiments, a solvent is present in a paste in a concentration of about 10% to about 99% by weight. In some implementations, a solvent is present in the fluoroelastomer composition in a maximum concentration of about 99%, about 98%, about 97%, about 95%, about 90%, about 80%, about 70%, about 60%, about 50%, about 40%, or about 30% by weight of the paste. In some implementations, a solvent is present in a minimum concentration of about 15%, about 20%, about 25%, about 30%, about 40%, about 50%, about 60%, about 70%, or about 80% by weight of the fluoroelastomer composition.

In some implementations, in order to control porosity in the formed coating layer, vacuum degassing is performed on the application material as well as the coated parts before curing.

FIG. 1 depicts a schematic diagram of a process chamber 100 including a substrate support pedestal 110, according to one or more implementations of the present disclosure. The substrate support pedestal 110 includes a bonded porous plug as described herein. The process chamber 100 includes a chamber body 102, which defines a processing volume 104. The substrate support pedestal 110 is positioned within the processing volume 104. The chamber body 102 includes a ceiling 106, a bottom wall 107, and one or more chamber walls 108. The ceiling 106 can be composed of a dielectric material.

Figure 2:
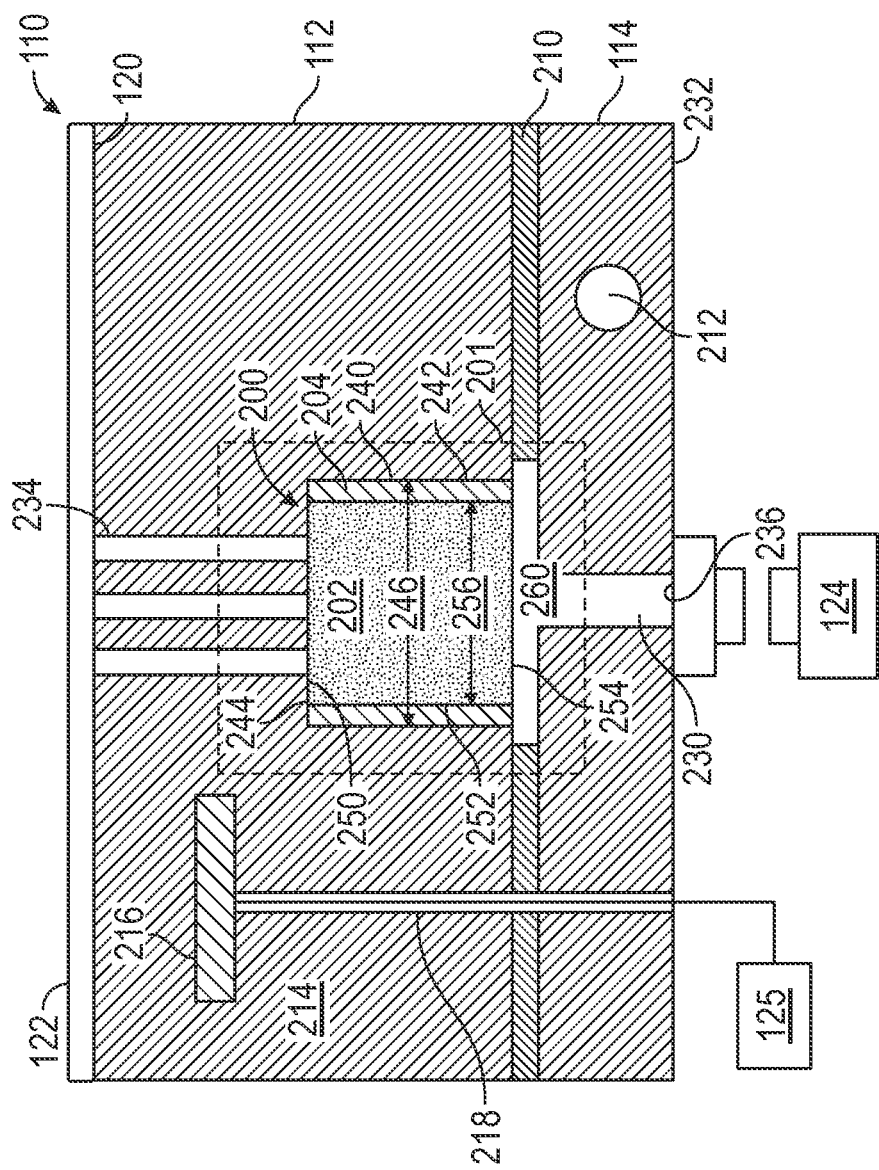
FIG. 2 is a partial cross-sectional view of the substrate support pedestal having a bonded porous plug according to one or more implementations of the present disclosure.
Figure 3:
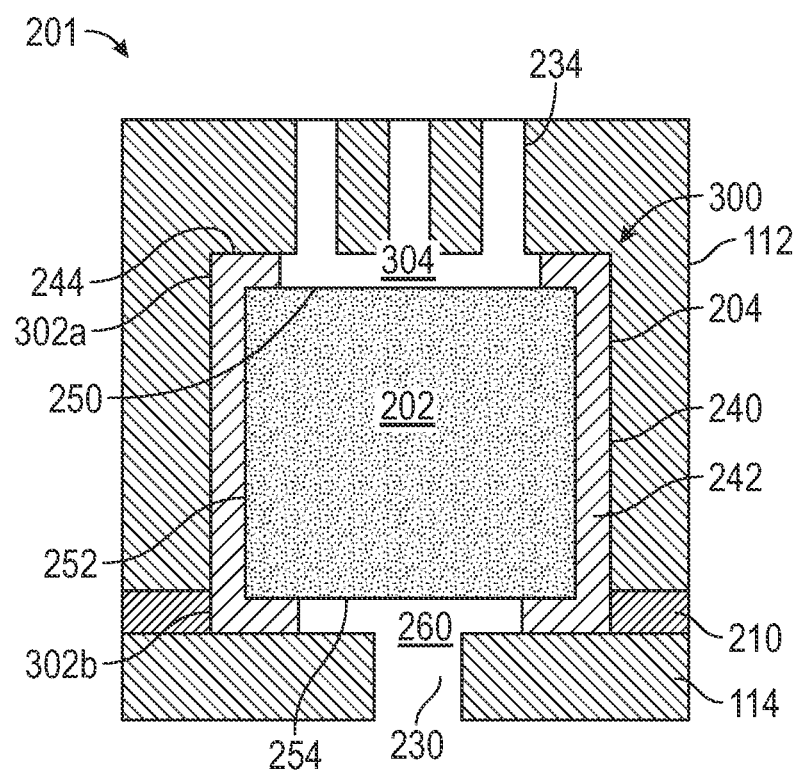
FIG. 3 is a partial cross-sectional view of the substrate support pedestal having a bonded porous plug according to one or more implementations of the present disclosure.

The substrate support pedestal 110 includes an electrostatic chuck 112 disposed on a cooling base 114. The electrostatic chuck 112 includes a bonded porous plug 200 as shown in FIG. 2 and FIG. 3. The porous plug 202 is bonded to the electrostatic chuck according to methods described herein. The substrate support pedestal 110 is generally supported above the bottom wall 107 of the process chamber 100 by a shaft 116 coupled to the cooling base 114. The substrate support pedestal 110 is fastened to the shaft 116 such that the substrate support pedestal 110 can be removed from the shaft 116, refurbished, and re-fastened to the shaft 116. The shaft 116 is sealed to the cooling base 114 to isolate various conduits and electrical leads disposed therein from the process environment within the process chamber 100. Alternatively, the electrostatic chuck 112 and cooling base 114 maybe disposed on an insulating plate that is attached to a ground plate or chassis. Further, the ground plate may be attached to one or more of the ceiling 106, the bottom wall 107, and the one or more chamber walls 108.

The electrostatic chuck 112 includes a support surface 120 for supporting a substrate, for example, a substrate 122, for example, a semiconductor substrate. The temperature of the substrate 122 is controlled by stabilizing the temperature of the electrostatic chuck 112. For example, a backside gas (e.g., helium or other gas) may be provided by a gas source 124 to a plenum defined between the substrate 122 and the support surface 120 of the electrostatic chuck 112. The backside gas is used to facilitate heat transfer between the substrate 122 and the substrate support pedestal 110 to control the temperature of the substrate 122 during processing. The electrostatic chuck 112 may include one or more heaters. For example, the heaters may be electrical heaters or the like. The electrostatic chuck 112 may include one or more electrodes, which may be coupled to a power supply 125.

The process chamber 100 further includes at least an inductive coil antenna segment 130A and a conductive coil antenna segment 130B, both positioned exterior to the ceiling 106. The inductive coil antenna segment 130A and the conductive coil antenna segment 130B are each coupled to a radio-frequency (RF) source 132 that produces an RF signal. The RF source 132 is coupled to the inductive coil antenna segment 130A and to the conductive coil antenna segment 130B through a matching network 134. The substrate support pedestal 110 is also coupled to an RF source 136 that produces an RF signal. The RF source 136 is coupled to the substrate support pedestal 110 through a matching network 138. The one or more chamber walls 108 can be conductive and connected to an electrical ground 140.

The pressure within the processing volume 104 of the process chamber 100 is controlled using a throttle valve 142 situated between the process chamber 100 and a vacuum pump 144. The temperature at the surface of the one or more chamber walls 108 is controlled using liquid-containing conduits (not shown) that are located in the one or more chamber walls 108 of the process chamber 100.

A system controller 150 is coupled to the various components of the process chamber 100 to facilitate control of the substrate processing process. The system controller 150 includes memory 152, a central processing unit (CPU) 154, and support circuits (or I/O) 156. Software instructions and data can be coded and stored within the memory for instructing the CPU. The system controller 150 can communicate with one or more of the components of the process chamber 100 via, for example, a system bus. A program (or computer instructions) readable by the system controller 150 determines which tasks are performable on a substrate. In some aspects, the program is software readable by the system controller 150. Although a single system controller 150 is shown, it should be appreciated that multiple system controllers can be used with the aspects described herein.

In operation, the substrate 122 is placed on the support surface 120 of the substrate support pedestal 110 and gaseous components are supplied from a gas panel 160 to the process chamber 100 through entry ports 162 to form a gaseous mixture in the processing volume 104 of the process chamber 100. The gaseous mixture in the processing volume 104 is ignited into a plasma in the process chamber 100 by applying RF power from the RF sources 132, 136 respectively to the inductive coil antenna segment 130A, the conductive coil antenna segment 130B and to the substrate support pedestal 110. Additionally, chemically reactive ions are released from the plasma and strike the substrate 122; thereby removing exposed material from the substrate's surface.

FIG. 2 is a partial cross-sectional view of the substrate support pedestal 110 having a bonded porous plug 200 according to one or more implementations of the present disclosure. The bonded porous plug 200 includes a porous plug 202 and a sealing layer 204. As discussed above, the substrate support pedestal 110 includes the cooling base 114 secured to the electrostatic chuck 112 by a bond layer 210.

The bond layer 210 comprises one or more materials such as an acrylic or silicon-based adhesive, epoxy, neoprene based adhesive, an optically clear adhesive such as a clear acrylic adhesive, or other suitable adhesive materials.

The cooling base 114 is generally fabricated from a metallic material such as stainless steel, aluminum, aluminum alloys, among other suitable materials. Further, the cooling base 114 includes one or more cooling channels 212 disposed therein that circulate a heat transfer fluid to maintain thermal control of the substrate support pedestal 110 and the substrate 122.

The electrostatic chuck 112 is generally circular in form but can alternatively comprise other geometries to accommodate non-circular substrates. For example, the electrostatic chuck 112 may comprise a square or rectangular substrate when used in processing display glass, such as such as glass for flat panels displays. The electrostatic chuck 112 generally includes a chuck body 214 including one or more electrodes 216. The electrodes 216 are comprised of an electrically conductive material such as copper, graphite, tungsten, molybdenum and the like. Various implementations of electrode structures include, but are not limited to, a pair of coplanar D-shaped electrodes, coplanar interdigital electrodes, a plurality of coaxial annular electrodes, a singular, circular electrode or other structure. The electrodes 216 are coupled to the power supply 125 by a feed through 218 disposed in the substrate support pedestal 110. The power supply 125 may drive the electrode 216 with a positive or negative voltage. For example, the power supply 125 may drive the electrode 216 with a voltage of about −1000 volts or a voltage of about 2500 volts. Alternatively, other negative voltages or other positive voltages may be utilized.

The chuck body 214 of the electrostatic chuck 112 can be fabricated from a ceramic material. For example, the chuck body 214 of the electrostatic chuck 112 may be fabricated from a low resistivity ceramic material, for example, a material having a resistivity between about $1 \times E^9$ to about $1 \times E^{11}$ ohm-cm. Examples of low resistivity materials include ceramics such as alumina doped with titanium oxide or chromium oxide, doped aluminum oxide, doped boron-nitride and the like. Other materials of comparable resistivity, for example, aluminum nitride, may also be used. Such ceramic materials having relatively low resistivity generally promote a Johnsen-Rahbek attractive force between the substrate and electrostatic chuck 112 when power is applied to the electrodes 216. Alternatively, a chuck body 214 comprising ceramic materials having a resistivity equal to or greater than $1 \times E^{11}$ ohms-cm may also be used. Further, the chuck body 214 of the electrostatic chuck 112 may be fabricated from an aluminum oxide. The aluminum oxide can have high resistivity and be used in Coulombic mode.

During operation, an electrical field generated by driving the electrodes 216 holds the substrate 122 on the support surface 120 with a clamping force.

A backside gas, for example, helium, nitrogen or argon, is introduced to one or more gas flow passages 230 by the gas source 124 to aid in the control of the temperature of the substrate 122 when it is retained by the electrostatic chuck 112. The gas flow passage 230 extends from the support surface 120 of the chuck body 214 to a bottom surface 232 of the cooling base 114. The gas flow passage 230 includes a plurality of gas passages 234 formed in the electrostatic chuck 112, an opening 236 formed in the cooling base 114, and a cavity 240 formed in the chuck body 214 of the electrostatic chuck 112. The cavity 240 is defined by at least one sidewall 242 and a top wall 244 formed in the chuck body 214. The sidewall 242 has a diameter 246. The cavity 240 may have a sectional area, such as a diameter, that is greater than a sectional area of at least the opening 236. Although described as cylindrical, the cavity 240 can have other suitable shapes. Further, while a single gas flow passage 230 is illustrated in FIG. 2, the substrate support pedestal 110 may include multiple gas flow passages.

The plurality of gas passages 234 extend from the support surface 120, through the chuck body 214 to the top wall 244 of the cavity 240 and are defined between the support surface 120 of the electrostatic chuck 112 and the top wall 244 of the cavity 240. In some implementations, the plurality of gas passages 234 are replaced with a single gas supply conduit, which extends from the support surface 120, through the chuck body 214 to the top wall 244 of the cavity 240. Further, the backside gas within the plurality of gas passages 234 provides a heat transfer medium between the electrostatic chuck 112 and the substrate 122. In operation, the backside gas is supplied by the gas source 124 traveling through the opening 236 through the porous plug 202 and into the plurality of gas passages 234. Further, each gas flow passage 230 terminates at the corresponding plurality of gas passages 234 formed through the support surface 120 of the chuck body 214.

The porous plug 202 is generally disposed within the gas flow passage 230 (within the cavity 240) such that it forms a part of the gas flow passage 230. The porous plug 202 provides a path for pressurized gas to flow between two surfaces of different electrical potential. The porous plug 202 can have an open-pore structure meaning that pores in the porous structure are interconnected allowing fluids to flow through the porous plug 202. In some implementations, more than half of the cells in the open-pore structure are interconnected. For example, the porous plug 202 provides a path for pressurized gas to flow between a first and second surface of the electrostatic chuck 112, and between a first surface of the electrostatic chuck 112 and a first surface of the cooling base 114. Further, the porous plug 202 comprises a plurality of small passageways and/or pores which reduce the probability that plasma will ignite in a gap 260 defined between the electrostatic chuck 112 and the cooling base 114 as compared to a design not including the porous plug 202. The porous plug 202 is generally comprised of a ceramic material such as aluminum oxide or aluminum nitride. Alternatively, the porous plug 202 may be comprised of other porous materials. Further, the porous plug 202 may have a porosity of about 30 to about 80 percent. Alternatively, the porous plug may have a porosity of less than 30 percent or greater than 80 percent.

The porous plug 202 can be any suitable shape. In some implementations, the porous plug 202 has a cylindrical shape. Other suitable shapes include t-shaped, tapered, and rectangular. As depicted in FIG. 2, the porous plug 202 includes a top surface 250, a sidewall 252, and a bottom surface 254. The sidewall 252 has a diameter 256. The diameter 256 of the sidewall 252 of the porous plug 202 is smaller than the diameter 246 defined by the at least one sidewall 242 of the cavity 240. The top surface 250 faces the top wall 244 of the cavity 240. The sidewall 252 of the porous plug 202 faces the at least one sidewall 242 of the cavity 240. The bottom surface 254 of the porous plug 202 faces a gap 260. The gap 260 is defined by the bottom surface 254 of the porous plug, the bond layer 210, and the cooling base 114. The gap 260 is formed in the bond layer 210 and is part of the gas flow passage 230. In some implementations, the bond layer 210 extends further into the gap 260. For example, the bond layer 210 can extend into the gap 260 to contact the sealing layer 204 or both the sealing layer 204 and the bottom surface 254 of the porous plug 202. In some implementations, the porous plug 202 may be positioned within the cavity 240 using various techniques such as press fitting, slip fitting, clearance fitting, pinning, and bonding, among others. For example, the porous plug 202 can be positioned within the cavity 240 such that the top surface 250 of the porous plug 202 is in contact with the top wall 244 of the cavity 240.

The sealing layer 204 is formed adjacent to the porous plug 202. The sealing layer 204 forms a seal or radial seal between the sidewall 252 of the porous plug 202 and the at least one sidewall 242 of the cavity 240. The sealing layer 204 may form at least a radial seal between the porous plug 202 and the cavity 240. Further, the sealing layer 204 secures the porous plug 202 within the cavity 240. For example, the sealing layer 204 may be coupled to at least one of the porous plug 202 and the at least one sidewall 242 of the cavity 240. The sealing layer 204 may mechanically secure the porous plug 202 to the at least one sidewall 242 of the cavity 240.

As described herein, the sealing layer 204 may be comprised of a resilient polymeric material, such as an elastomer. Further, the sealing layer 204 may be comprised of one or more of a fluoroelastomer material, for example, a FKM, and a perfluoroelastomer material, for example, a FFKM. Further, the sealing layer 204 may be comprised of a material that is erosion resistive to the process gases. For example, erosion resistive materials do not erode in the presence of process gases. Additionally, or alternatively, the material of the sealing layer 204 is selected such that the material does not penetrate the porous plug 202. The sealing layer 204 may be in the shape of an O-ring, a cylindrical gasket, or other ring-shaped seal. Further, the sealing layer 204 may be comprised of a substantially non-adhesive material. The sealing layer 204 is formed from a material that is applied in one of a liquid, paste and/or gel and changes state to a substantially solid or gel form.

The sealing layer 204 typically has a thickness sufficient to seal the gap between the surfaces of the porous plug and the surfaces of the walls that define the cavity 240. In some implementations, the sealing layer 204 has a thickness of about 25 micrometers to about 2,000 micrometers. In some implementations, the sealing layer 204 has a minimum thickness of about 25 micrometers, about 50 micrometers, about 100 micrometers, about 150 micrometers, about 200 micrometers, about 250 micrometers, about 300 micrometers, about 400 micrometers, about 500 micrometers, about 600 micrometers, about 750 micrometers cP, about 1,000 micrometers, about 1,250 micrometers, about 1,500 micrometers, about 1,750 micrometers, about 1,850 micrometers, or about 1,950 micrometers. In some implementations, the sealing layer 204 has a maximum thickness of about 2,000 micrometers, about 1,950 micrometers, about 1,850 micrometers, about 1,750 micrometers, about 1,500 micrometers, about 1,250 micrometers, about 1,000 micrometers, about 750 micrometers, about 600 micrometers, about 500 micrometers, about 400 micrometers, about 300 micrometers, about 250 micrometers, about 200 micrometers, about 150 micrometers, about 100 micrometers, or about 50 micrometers.

The bond layer 210 secures the chuck body 214 to the cooling base 114. As the material or materials that typically make up the bond layer 210 are susceptible to erosion in the presence of the process gases used during substrate processing, various methods for protecting the bond layer 210 from the process gases have been explored. Advantageously, by employing a sealing layer, e.g., the sealing layer 204, which is highly erosion resistive to the process gases, the process gas passing through the porous plug 202 may be prevented. Thus, the life of the bond layer 210 is increased. Additionally, the useful service life of the substrate support pedestal 110 is increased.

FIG. 3 is a partial cross-sectional view of a portion 201 of the substrate support pedestal 110 having a bonded porous plug 300 according to one or more implementations of the present disclosure. The bonded porous plug 300 is similar to the bonded porous plug 200 except that at least one of the top surface 250 and the bottom surface 254 of the bonded porous plug 300 are partially coated with an additional sealing layer 302a, 302b (collectively 302). The additional sealing layer 302 provides additional protection against process gases and further reduces erosion of the bond layer 210. The top sealing layer 302a is formed between the top wall 244 of the cavity 240 and the top surface 250 of the porous plug 202. The top sealing layer 302a forms an axial seal between the top wall 244 of the cavity 240 and the top surface 250 of the porous plug 202. A gap 304 is defined by the top sealing layer 302a. The gap 304 is part of the gas flow passage 230 and allows for air flowing through the porous plug 202 to reach the plurality of gas passages 234 and the backside of the substrate 122. The top sealing layer 302a may be in the shape of a gasket. The bottom sealing layer 302b is formed between the bottom surface 254 of the porous plug, the bond layer 210, and the cooling base 114. The gap 260 is further defined by the bottom sealing layer 302b. The gap 260 allows for air to reach and flow through the porous plug 202 and reach the plurality of gas passages 234 and the backside of the substrate 122. The bottom sealing layer 302b may be in the shape of a gasket. In some implementations, the sealing layer 204, the top sealing layer 302a, and the bottom sealing layer 302b are separate layers. In other implementations, the sealing layer 204, the top sealing layer 302a, and the bottom sealing layer 302b form an integral layer.

Figure 4:
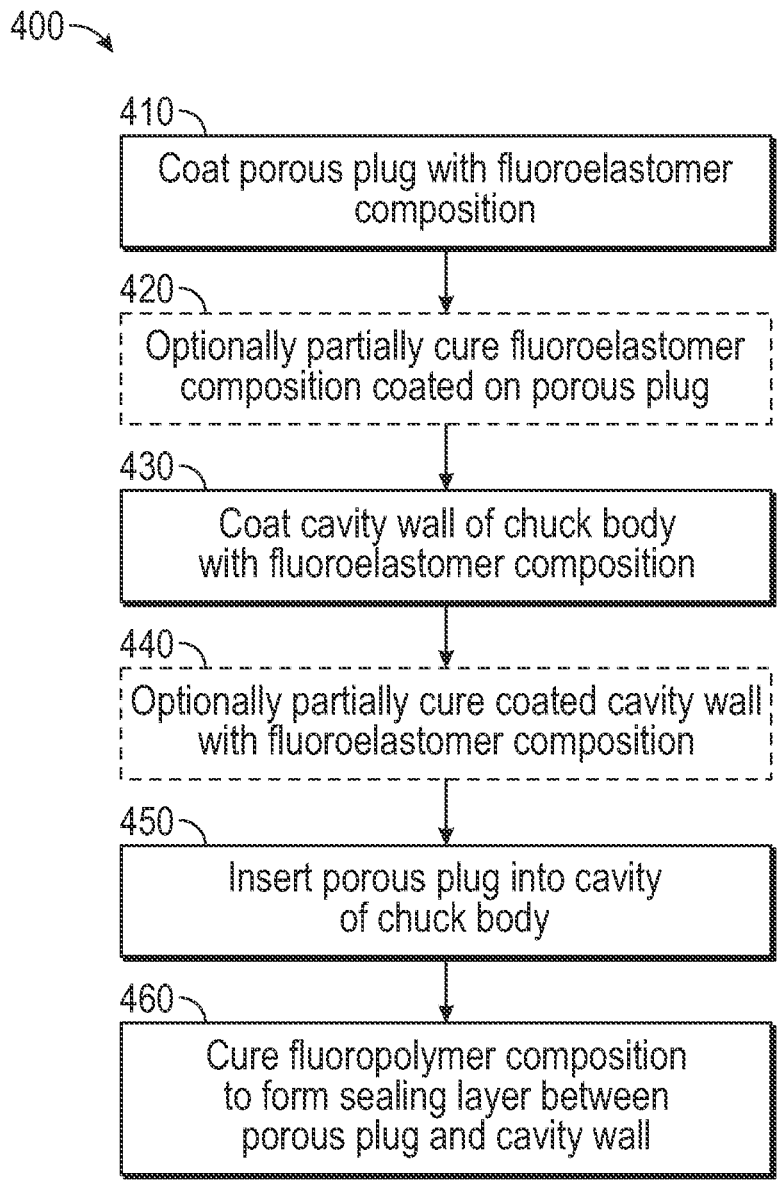
FIG. 4 is a flowchart of one example of a method of forming a substrate pedestal having a bonded porous plug according to one or more implementations of the present disclosure.

FIG. 4 is a flowchart of one example of a method 400 of forming a substrate pedestal having a bonded porous plug according to one or more implementations of the present disclosure. The bonded porous plug includes a porous plug and a sealing layer. The sealing layer can be composed of a fluoroelastomer (FKM), a perfluoroelastomer (FFKM), or a combination thereof. The sealing layer can be formed from the fluoroelastomer composition described herein. The method 400 can be used to produce the bonded porous plug 200, 300 shown in FIG. 2 and FIG. 3 respectively. Although discussed with reference to FIG. 2 and FIG. 3 it should be understood that the method 400 can be used with other porous plug and substrate pedestal designs.

At operation 410, the porous plug is coated with a fluoroelastomer composition to form a first coating on the porous plug. The viscosity of the fluoroelastomer composition can be adjusted to ease application of the fluoroelastomer composition to the porous plug. Referring to FIG. 2 and FIG. 3, the fluoroelastomer composition can be applied to at least one of the top surface 250, the bottom surface 254, and the sidewall 252 of the porous plug 202. In one example, the fluoroelastomer composition is applied to the sidewall 252 only. In another example, the fluoroelastomer composition is applied to the sidewall 252, the bottom surface 254, and the top surface 250 of the porous plug 202. In yet another example, the fluoroelastomer composition is applied to the sidewall 252 and either the bottom surface 254 or the top surface 250 of the porous plug 202. The first coating can have a thickness of about 25 microns to about 1,000 microns, for example, from about 50 microns to about 100 microns.

Optionally, at operation 420, the fluoroelastomer composition coated on the porous plug is partially cured or semi-cured. Any suitable partially curing or semi-curing process can be used.

At operation 430, the cavity of the chuck body is coated with the fluoroelastomer composition to form a second coating. The viscosity of the fluoroelastomer composition can be adjusted to ease application of the fluoroelastomer composition to the cavity of the chuck body. Referring to FIG. 2 and FIG. 3, the fluoroelastomer composition can be applied to at least one of the at least one sidewall 242 and the top wall 244 that define the cavity 240 formed in the chuck body 214 of the electrostatic chuck 112. The second coating can have a thickness of about 25 microns to about 1,000 microns, for example, from about 50 microns to about 100 microns.

Optionally, at operation 440, the fluoroelastomer composition coated on the cavity walls defining the cavity is partially cured or semi-cured. Any suitable partially curing or semi-curing process can be used.

At operation 450, the porous plug having the fluoroelastomer composition deposited thereon, either uncured or partially cured, is inserted into the cavity having the fluoroelastomer composition deposited on the walls defining the cavity, either uncured or partially cured such that the fluoroelastomer composition coated on the walls defining the cavity contact the fluoroelastomer composition coated on the porous plug. In some implementations, the porous plug 202 may be positioned within the cavity 240 using various techniques such as press fitting, slip fitting, clearance fitting, pinning, and bonding, among others.

At operation 460, the fluoroelastomer composition formed between the porous plug and the walls defining the cavity are cured to form a sealing layer between the porous plug and the walls defining the cavity.

Figure 5:
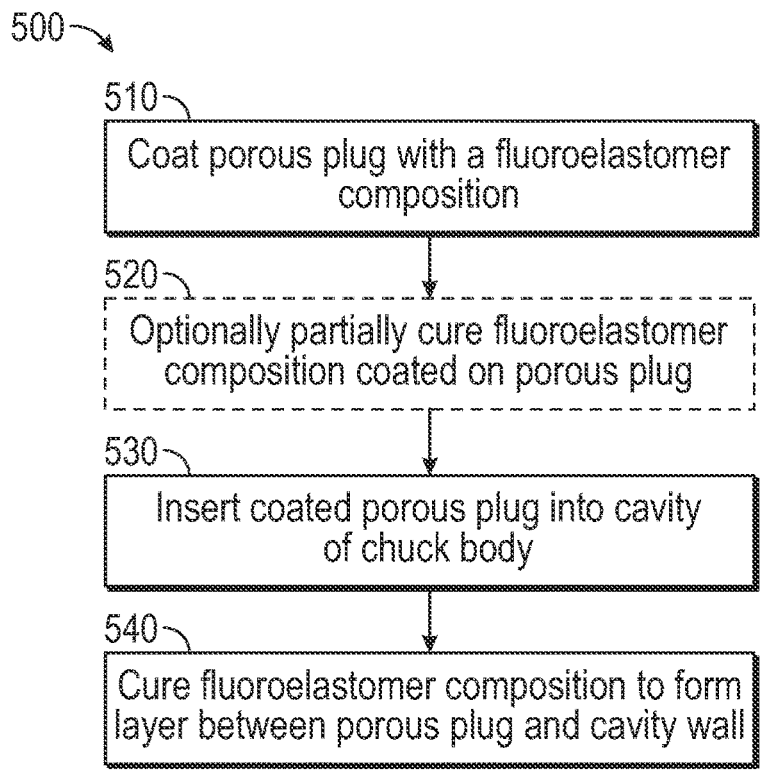
FIG. 5 is a flowchart of another example of a method of forming a substrate pedestal having a bonded porous plug according to one or more implementations of the present disclosure.

FIG. 5 is a flowchart of another example of a method 500 of forming a substrate pedestal having a bonded porous plug according to one or more implementations of the present disclosure. The bonded porous plug includes a porous plug and a sealing layer. The sealing layer can be composed of a fluoroelastomer (FKM), a perfluoroelastomer (FFKM), or a combination thereof. The sealing layer can be formed from the fluoroelastomer composition described herein. The method 500 can be used to produce the bonded porous plug 200, 300 shown in FIG. 2 and FIG. 3 respectively. Although discussed with reference to FIG. 2 and FIG. 3 it should be understood that the method 500 can be used with other porous plug and substrate pedestal designs.

At operation 510, the porous plug is coated with a fluoroelastomer composition. The viscosity of the fluoroelastomer composition can be adjusted to ease application of the fluoroelastomer composition to the porous plug. Referring to FIG. 2 and FIG. 3, the fluoroelastomer composition can be applied to at least one of the top surface 250, the bottom surface 254, and the sidewall 252 of the porous plug 202. In one example, the fluoroelastomer composition is applied to the sidewall 252 only. In another example, the fluoroelastomer composition is applied to the sidewall 252, the bottom surface 254, and the top surface 250 of the porous plug 202. In yet another example, the fluoroelastomer composition is applied to the sidewall 252 and either the bottom surface 254 or the top surface 250 of the porous plug 202.

Optionally, at operation 520, the fluoroelastomer composition coated on the porous plug is partially cured or semi-cured. Any suitable partially curing or semi-curing process can be used.

At operation 530, the porous plug having the fluoroelastomer composition deposited thereon, either uncured or partially cured, is inserted into the cavity such that the fluoroelastomer composition coated on the porous plug contacts the walls defining the cavity. In some implementations, the porous plug 202 may be positioned within the cavity 240 using various techniques such as press fitting, slip fitting, clearance fitting, pinning, and bonding, among others.

At operation 540, the fluoroelastomer composition formed between the porous plug and the walls defining the cavity is cured to form a sealing layer between the porous plug and the walls defining the cavity.

Figure 6:
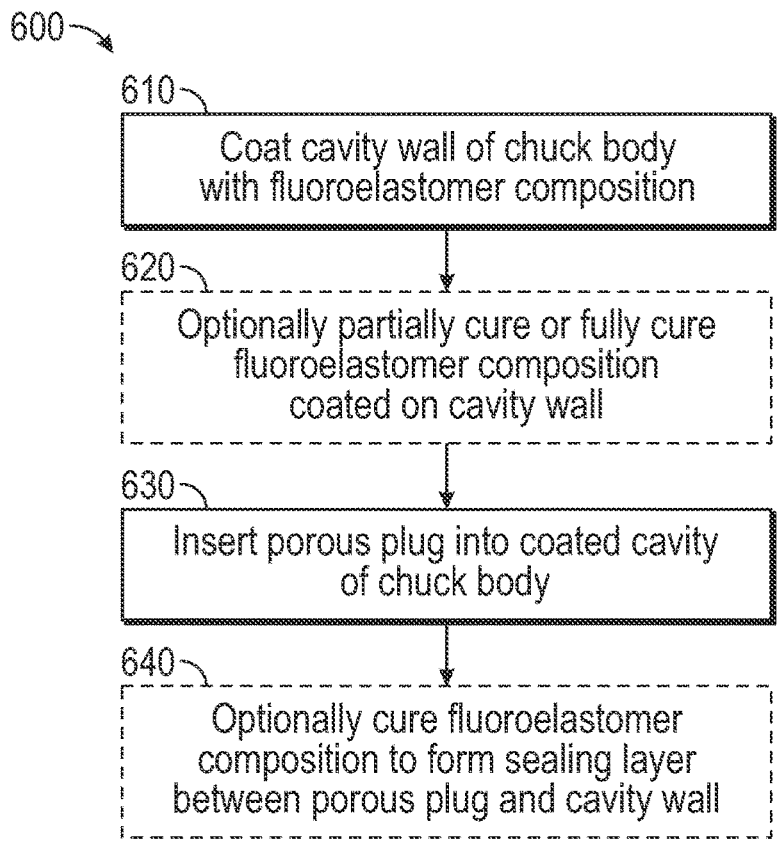
FIG. 6 is a flowchart of yet another example of a method of forming a substrate pedestal having a bonded porous plug according to one or more implementations of the present disclosure.

FIG. 6 is a flowchart of yet another example of a method 600 of forming a substrate pedestal having a bonded porous plug according to one or more implementations of the present disclosure. The bonded porous plug includes a porous plug and a sealing layer. The sealing layer can be composed of a fluoroelastomer (FKM), a perfluoroelastomer (FFKM), or a combination thereof. The sealing layer can be formed from the fluoroelastomer composition described herein. The method 600 can be used to produce the bonded porous plug 200, 300 shown in FIG. 2 and FIG. 3 respectively. Although discussed with reference to FIG. 2 and FIG.

3 it should be understood that the method 500 can be used with other porous plug and substrate pedestal designs.

At operation 610, the cavity wall of the chuck body is coated with the fluoroelastomer composition. The viscosity of the fluoroelastomer composition can be adjusted to ease application of the fluoroelastomer composition to the cavity of the chuck body. Referring to FIG. 2 and FIG. 3, the fluoroelastomer composition can be applied to at least one of the at least one sidewall 242 and the top wall 244 that define the cavity 240 formed in the chuck body 214 of the electrostatic chuck 112.

Optionally, at operation 620, the fluoroelastomer composition coated on the cavity walls defining the cavity is partially cured or semi-cured. Any suitable partially curing or semi-curing process can be used.

At operation 630, the porous plug is inserted into the cavity such that the porous plug contacts the fluoroelastomer composition formed on the walls defining the cavity. In some implementations, the porous plug 202 may be positioned within the cavity 240 using various techniques such as press fitting, slip fitting, clearance fitting, pinning, and bonding, among others.

At operation 640, the fluoroelastomer composition formed on the walls defining the cavity is cured to form a sealing layer between the porous plug and the walls defining the cavity.

Figure 7:
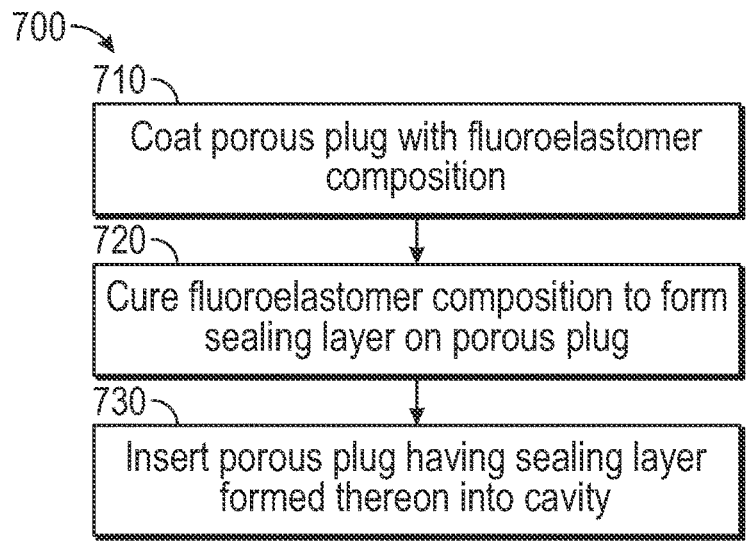
FIG. 7 is a flowchart of yet another example of a method of forming a substrate pedestal having a bonded porous plug according to one or more implementations of the present disclosure.

FIG. 7 is a flowchart of yet another example of a method 700 of forming a substrate pedestal having a bonded porous plug according to one or more implementations of the present disclosure. The bonded porous plug includes a porous plug and a sealing layer. The sealing layer can be composed of a fluoroelastomer (FKM), a perfluoroelastomer (FFKM), or a combination thereof. The sealing layer can be formed from the fluoroelastomer composition described herein. The method 700 can be used to produce the bonded porous plug 200, 300 shown in FIG. 2 and FIG. 3 respectively. Although discussed with reference to FIG. 2 and FIG. 3 it should be understood that the method 700 can be used with other porous plug and substrate pedestal designs.

At operation 710, the porous plug is coated with a fluoroelastomer composition. The viscosity of the fluoroelastomer composition can be adjusted to ease application of the fluoroelastomer composition to the porous plug. Referring to FIG. 2 and FIG. 3, the fluoroelastomer composition can be applied to at least one of the top surface 250, the bottom surface 254, and the sidewall 252 of the porous plug 202. In one example, the fluoroelastomer composition is applied to the sidewall 252 only. In another example, the fluoroelastomer composition is applied to the sidewall 252, the bottom surface 254, and the top surface 250 of the porous plug 202. In yet another example, the fluoroelastomer composition is applied to the sidewall 252 and either the bottom surface 254 or the top surface 250 of the porous plug 202.

At operation 720, the fluoroelastomer composition formed on the porous plug is cured to form a sealing layer on the porous plug. In some examples where the sealing layer 204 is formed on the sidewall 252 and at least one of the bottom sealing layer 302b is formed on the bottom surface 254 and the top sealing layer 302a is formed on the top surface 250 of the porous plug 202, portions for the top sealing layer 302a can be removed to form the gap 304 and portions of the bottom sealing layer 302b can be removed to form gap 260, which allows for gases to flow through the porous plug. The portions of the top sealing layer 302a and the bottom sealing layer 302b can be removed before semi-curing and/or curing or after semi-curing or curing of the fluoroelastomer composition that forms the sealing layers.

At operation 730, the porous plug having the sealing layer formed thereon is inserted into the cavity such that the sealing layer contacts the walls defining the cavity. In some implementations, the porous plug 202 having sealing layer may be positioned within the cavity 240 using various techniques such as press fitting, slip fitting, clearance fitting, pinning, and bonding, among others.

Figure 8:
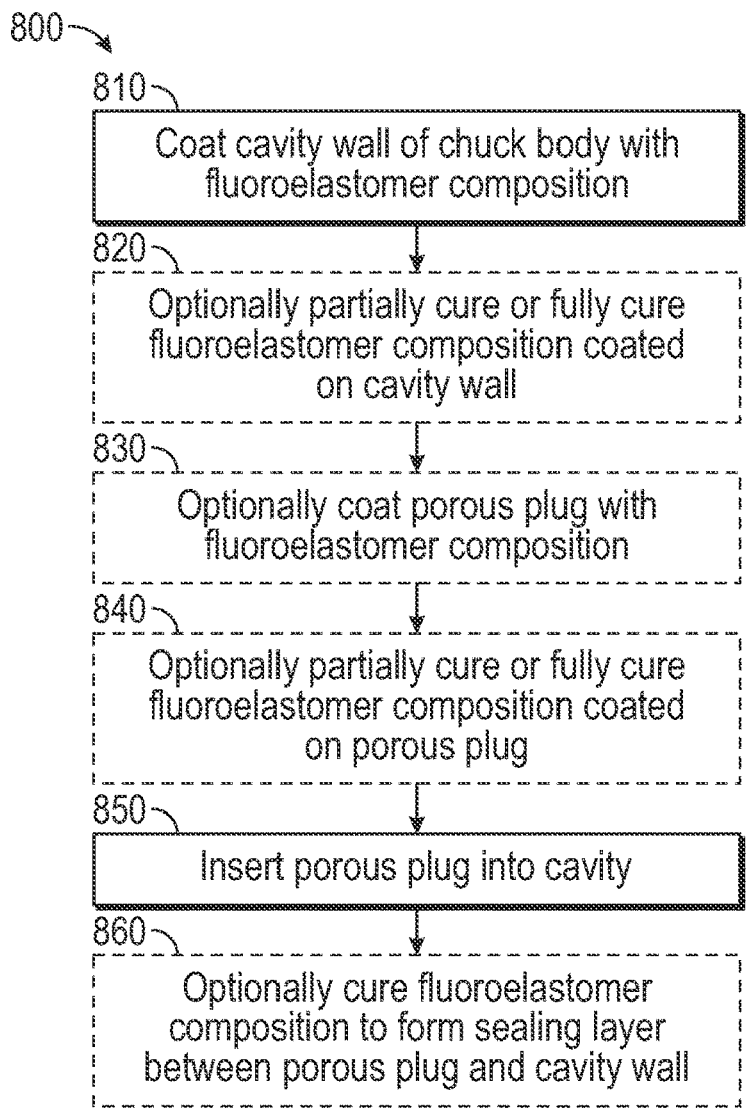
FIG. 8 is a flowchart of yet another example of a method of forming a substrate pedestal having a bonded porous plug according to one or more implementations of the present disclosure.

FIG. 8 is a flowchart of yet another example of a method 800 of forming a substrate pedestal having a bonded porous plug according to one or more implementations of the present disclosure. FIGS. 9A-9C depict schematic cross-sectional views of forming a substrate pedestal having a bonded porous plug according to one or more implementations of the present disclosure. The bonded porous plug includes a porous plug and a sealing layer. The sealing layer can be composed of a fluoroelastomer (FKM), a perfluoroelastomer (FFKM), or a combination thereof. The sealing layer can be formed from the fluoroelastomer composition described herein. The method 800 can be used to produce the bonded porous plug 200, 300 shown in FIG. 2 and FIG. 3 respectively. Although discussed with reference to FIG. 2, FIG. 3, and FIGS. 9A-9C it should be understood that the method 800 can be used with other porous plug and substrate pedestal designs.

At operation 810, the walls of the cavity of the chuck body 214 are coated with a fluoroelastomer composition 904, for example, the fluoroelastomer composition described herein. The viscosity of the fluoroelastomer composition 904 can be adjusted to ease application of the fluoroelastomer composition to the walls of the cavity 240 of the chuck body 214. Referring to FIG. 9, the fluoroelastomer composition 904 can be applied to at least one of the at least one sidewall 242 and the top wall 244 that define the cavity 240 formed in the chuck body 214 of the electrostatic chuck 112 as shown in FIG. 9A.

Optionally, at operation 820, the fluoroelastomer composition 904 coated on the walls defining the cavity 240 can be partially cured or fully cured. Any suitable partial curing or curing process can be used.

Optionally, at operation 830, the porous plug can be coated with the fluoroelastomer composition 904 as previously described herein.

Optionally, at operation 840, the fluoroelastomer composition 904 coated on the porous plug 202 can be partially cured or fully cured. Any suitable partial curing or curing process can be used.

At operation 850, the porous plug 202 is inserted into the cavity 240 such that the porous plug 202 contacts the fluoroelastomer composition 904 formed on the walls defining the cavity 240. FIG. 9C depicts an enlarged partial cross-sectional view of a portion of FIG. 9B. As shown in FIG. 9C, the viscosity of the fluoroelastomer composition 904 is adjusted so that the fluoroelastomer composition 904 fills or partially fills surface pores 910 positioned along the outer surface or sidewall of the porous plug 202 without substantially filling internal pores 920 of the of the porous plug 202. The fluoroelastomer composition 904 bonds the porous plug 202 to the walls of the cavity 240 or holds it by the elastic nature of the bond material putting compressive forces on the various surfaces of the porous plug 202 and/or sidewalls of the cavity 240.

At operation 860, the fluoroelastomer composition 904 formed on the walls defining the cavity is cured to form a sealing layer, for example, the sealing layer 204 as shown in FIG. 2 and FIG. 3, between the porous plug 202 and the walls defining the cavity 240.

The sealing members and porous plugs described herein are suitable for use in substrate support pedestals for protecting the bond layer that bonds the cooling base with the electrostatic chuck from the process gases. Advantageously, protecting the bond layer from the process gases reduces erosion of the bond layer, and maintaining a substantially uniform temperature on a substrate. For example, sealing members that are erosion resistive to the process gases may be utilized to form a radial seal and/or vertical seal between porous plugs of the electrostatic chuck. Such sealing members prevent the flow of process gases into the gap between the electrostatic chuck and the cooling base, and reduce the erosion of the bond layer. Accordingly, a substantially uniform thermal transfer between the cooling base and the electrostatic chuck and a uniform temperature on the substrate is maintained.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Embodiments of the present disclosure further relate to any one or more of the following examples 1-20:

1. A method of manufacturing a chuck body, comprising: coating a porous plug with a coating comprising a fluoroelastomer composition; inserting the porous plug having the coating formed thereon into a cavity formed in a chuck body; and curing the coating to form a sealing layer between the porous plug and a wall of the cavity.

2. The method according to example 1, wherein the coating has a thickness of about 25 microns to about 1,000 microns.

3. The method according to example 1 or 2, further comprising partially curing the coating to form a partially-cured fluoroelastomer layer on the porous plug prior to inserting the porous plug.

4. The method according to any one of examples 1-3, wherein the sealing layer forms a radial seal between the porous plug and the wall of the cavity.

5. The method according to any one of examples 1-4, wherein the sealing layer further forms at least one of a first axial seal between the porous plug and a cooling base bonded to the chuck body and a second axial seal between a top surface of the porous plug and a second wall of the cavity.

6. The method according to any one of examples 1-5, wherein the fluoroelastomer composition is in the form of a paste having a viscosity of about 50 cP to about 5,000 cP.

7. The method according to any one of examples 1-6, wherein the fluoroelastomer composition comprises at least one perfluoropolymer.

8. The method according to any one of examples 1-7, wherein the fluoroelastomer composition further comprises at least one of curing agents, adhesion promoters, thickening agents, solvents, and fillers.

9. A method of manufacturing a chuck body, comprising: coating a wall of a cavity formed in a chuck body with a coating comprising a fluoroelastomer composition; inserting a porous plug into the cavity having; and curing the coating to form a sealing layer between the porous plug and the wall of the cavity.

10. The method according to example 9, further comprising partially curing the coating to form a partially-cured fluoroelastomer layer on the wall of the cavity prior to inserting the porous plug.

11. The method according to example 9 or 10, wherein the sealing layer forms a radial seal between the porous plug and the wall of the cavity.

12. The method according to any one of examples 9-11, wherein the sealing layer further forms at least one of a first axial seal between the porous plug and a cooling base bonded to the chuck body and a second axial seal between a top surface of the porous plug and a second wall of the cavity.

13. The method according to any one of examples 9-12, wherein the fluoroelastomer composition is in the form of a paste having a viscosity of about 50 cP to about 5,000 cP.

14. The method according to any one of examples 9-13, wherein the fluoroelastomer composition comprises at least one perfluoropolymer.

15. The method according to any one of examples 9-14, wherein the fluoroelastomer composition further comprises at least one of curing agents, adhesion promoters, thickening agents, solvents, and fillers.

16. A method of manufacturing a chuck body, comprising: coating a porous plug with a first coating comprising a fluoroelastomer composition; coating a wall of a cavity formed in a chuck body with a second coating comprising the fluoroelastomer composition; inserting the porous plug having the first coating formed thereon into the cavity having the second coating formed thereon; and curing the first coating and the second coating to form a sealing layer between the porous plug and the wall of the cavity.

17. The according to example 16, further comprising partially curing at least one of the first coating and the second coating to form a partially-cured fluoroelastomer layer on at least one of the porous plug and the wall of the cavity prior to inserting the porous plug.

18. The according to example 16 or 17, wherein the sealing layer forms a radial seal between the porous plug and the wall of the cavity.

19. The method according to any one of examples 16-18, wherein the sealing layer further forms at least one of a first axial seal between the porous plug and a cooling base bonded to the chuck body and a second axial seal between a top surface of the porous plug and a second wall of the cavity.

20. The method according to any one of examples 16-19, wherein the fluoroelastomer composition is in the form of a paste having a viscosity of about 50 cP to about 5,000 cP and comprises at least one perfluoropolymer and optionally at least one of curing agents, adhesion promoters, thickening agents, solvents, and fillers.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical minimum values and a set of numerical maximum values. It should be appreciated that ranges including the combination of any two values, e.g., the combination of any minimum value with any maximum value, the combination of any two minimum values, and/or the combination of any two maximum values are contemplated unless otherwise indicated. Certain minimum values, maximum values, and ranges appear in one or more claims below.

The invention claimed is:

1. A method of manufacturing a chuck body, comprising:
coating a porous plug with a coating comprising an elastomer composition, wherein the elastomer composition comprises a thickening agent comprising cellulose;
inserting the porous plug having the coating formed thereon into a cavity formed in the chuck body; and
curing the coating to form a sealing layer between the porous plug and a wall of the cavity.

2. The method of claim 1, wherein the coating has a thickness of about 25 microns to about 1,000 microns.

3. The method of claim 1, further comprising partially curing the coating to form a partially-cured fluoroelastomer layer on the porous plug prior to inserting the porous plug.

4. The method of claim 1, wherein the sealing layer forms a radial seal between the porous plug and the wall of the cavity.

5. The method of claim 4, wherein the sealing layer further forms at least one of a first axial seal between the porous plug and a cooling base bonded to the chuck body and a second axial seal between a top surface of the porous plug and a second wall of the cavity.

6. The method of claim 1, wherein the elastomer composition is in the form of a paste having a viscosity of about 50 cP to about 5,000 cP.

7. The method of claim 6, wherein the elastomer composition comprises at least one perfluoropolymer, and wherein the cellulose comprises a metal salt of a carboxyalkylcellulose derivative, an alkylcellulose derivative, an oxidized alkylcellulose derivative, or any combination thereof.

8. The method of claim 7, wherein the elastomer composition further comprises at least one of curing agents, adhesion promoters, solvents, and fillers.

9. The method of claim 1, wherein the cellulose comprises sodium carboxymethylcellulose, methylcellulose, ethylcellulose, hydroxyethylcellulose, hydroxypropylcellulose, hydroxypropylmethylcellulose, or any combination thereof.

10. A method of manufacturing a chuck body, comprising:
coating a wall of a cavity formed in the chuck body with a coating comprising an elastomer composition, wherein the elastomer composition is in the form of a paste having a viscosity of about 50 cP to about 5,000 cP, and wherein the elastomer composition comprises a thickening agent comprising cellulose;
inserting a porous plug into the cavity having the coating; and
curing the coating to form a sealing layer between the porous plug and the wall of the cavity.

11. The method of claim 10, further comprising partially curing the coating to form a partially-cured fluoroelastomer layer on the wall of the cavity prior to inserting the porous plug.

12. The method of claim 10, wherein the sealing layer forms a radial seal between the porous plug and the wall of the cavity.

13. The method of claim 10, wherein the sealing layer further forms at least one of a first axial seal between the porous plug and a cooling base bonded to the chuck body and a second axial seal between a top surface of the porous plug and a second wall of the cavity.

14. The method of claim 10, wherein the elastomer composition is in the form of a paste having a viscosity of about 100 cP to about 3,000 cP.

15. The method of claim 14, wherein the elastomer composition comprises at least one perfluoropolymer, and wherein the cellulose comprises a metal salt of a carboxyalkylcellulose derivative, an alkylcellulose derivative, an oxidized alkylcellulose derivative, or any combination thereof.

16. The method of claim 15, wherein the elastomer composition further comprises at least one of curing agents, adhesion promoters, solvents, and fillers.

17. The method of claim 10, wherein the cellulose comprises sodium carboxymethylcellulose, methylcellulose, ethylcellulose, hydroxyethylcellulose, hydroxypropylcellulose, hydroxypropylmethylcellulose, or any combination thereof.

18. A method of manufacturing a chuck body, comprising:

coating a porous plug with a first coating comprising an elastomer composition, wherein the elastomer composition comprises a thickening agent comprising cellulose;

coating a wall of a cavity formed in the chuck body with a second coating comprising the elastomer composition;

inserting the porous plug having the first coating formed thereon into the cavity having the second coating formed thereon; and curing the first coating and the second coating to form a sealing layer between the porous plug and the wall of the cavity.

19. The method of claim 18, further comprising partially curing at least one of the first coating and the second coating to form a partially-cured fluoroelastomer layer on at least one of the porous plug and the wall of the cavity prior to inserting the porous plug.

20. The method of claim 18, wherein the sealing layer forms a radial seal between the porous plug and the wall of the cavity.

21. The method of claim 20, wherein the sealing layer further forms at least one of a first axial seal between the porous plug and a cooling base bonded to the chuck body and a second axial seal between a top surface of the porous plug and a second wall of the cavity.

22. The method of claim 20, wherein the elastomer composition is in the form of a paste having a viscosity of about 50 cP to about 5,000 cP and comprises at least one perfluoropolymer and optionally at least one of curing agents, adhesion promoters, solvents, and fillers.

23. The method of claim 18, wherein the cellulose comprises sodium carboxymethylcellulose, methylcellulose, ethylcellulose, hydroxyethylcellulose, hydroxypropylcellulose, hydroxypropylmethylcellulose, or any combination thereof.

* * * * *